US 6,855,467 B2

(12) United States Patent
Amemiya

(10) Patent No.: US 6,855,467 B2
(45) Date of Patent: Feb. 15, 2005

(54) TRANSFER MASK, METHOD OF DIVIDING PATTERN OR TRANSFER MASK, AND METHOD OF MANUFACTURING TRANSFER MASK

(75) Inventor: Isao Amemiya, Tokyo (JP)

(73) Assignee: Hoya Corporation (JP)

( * ) Notice: Subject to any disclaimer, the term of this patent is extended or adjusted under 35 U.S.C. 154(b) by 0 days.

(21) Appl. No.: 10/129,414

(22) PCT Filed: Sep. 4, 2001

(86) PCT No.: PCT/JP01/07649

§ 371 (c)(1),
(2), (4) Date: Oct. 31, 2002

(87) PCT Pub. No.: WO02/21582

PCT Pub. Date: Mar. 14, 2002

(65) Prior Publication Data

US 2003/0115733 A1 Jun. 26, 2003

Related U.S. Application Data

(60) Provisional application No. 60/230,559, filed on Sep. 5, 2000.

(51) Int. Cl.⁷ .................................................. G03F 9/00
(52) U.S. Cl. ............................ 430/30; 430/5; 430/296; 716/19; 716/21
(58) Field of Search .............................. 430/5, 30, 296, 430/942; 716/19–21

(56) References Cited

U.S. PATENT DOCUMENTS

| | | | | |
|---|---|---|---|---|
| 5,260,151 A | * | 11/1993 | Berger et al. | 430/5 |
| 5,798,194 A | * | 8/1998 | Nakasuji et al. | 430/5 |
| 6,200,710 B1 | * | 3/2001 | Hada | 430/5 |
| 6,261,726 B1 | * | 7/2001 | Brooks et al. | 430/5 |
| 6,638,665 B2 | * | 10/2003 | Kobinata | 430/5 |
| 6,732,351 B2 | * | 5/2004 | Yamashita | 716/19 |
| 2003/0017401 A1 | * | 1/2003 | Kawata et al. | 430/5 |

OTHER PUBLICATIONS

International Search Report re application No. PCT/JP01/07649, mailed Dec. 4, 2001.

* cited by examiner

Primary Examiner—Mark F. Huff
Assistant Examiner—Kripa Sagar
(74) Attorney, Agent, or Firm—Cook, Alex, McFarron, Manzo, Cummings & Mehler, Ltd.

(57) ABSTRACT

A pattern of a transfer mask to transfer, by the use of energy beams, a transfer pattern to a substrate is disclosed, the transfer mask made by forming an aperture pattern in a thin film portion supported by a supporting frame portion. When the transfer pattern includes a shielding pattern in which one part is connected to at least the periphery of the transfer mask, a shielding pattern portion, where the ratio of the surface area of the pattern surface portion on the transfer mask to a sectional area of a supporting portion is larger than 5000, is divided and developed.

12 Claims, 3 Drawing Sheets

TRANSFER MASK, METHOD OF DIVIDING PATTERN OR TRANSFER MASK, AND METHOD OF MANUFACTURING TRANSFER MASK

This application claims benefit of 60/230,559 filed Sep. 5, 2000.

TECHNICAL FIELD

The present invention relates to a stencil type transfer mask having an aperture pattern to transfer a pattern onto a substrate to be transferred using an electron-beam projection exposure method, and a pattern transfer method using the transfer mask.

BACKGROUND ART

In lithography technologies to form an interconnection pattern or the like, in association with trends towards extreme fine pattern designing, it is difficult to form a pattern using an optical lithography technology as a conventional general-purpose technology. To realize finer pattern designing, exposure technologies using charged-particle beams such as electron beams or ion beams, and short-wavelength beams from an X-ray source are being considered with optimism. Among them, in an electron-beam delineation technology, an initial point-beam delineation and a variable-shape delineation method for changing the size or shape of a rectangular beam to delineating a pattern have been proposed. In addition a cell projection delineation method for delineating a part of a pattern partially together through a mask and repeating such a processing has been proposed from the viewpoint of an improvement of the pattern accuracy and a reduction in delineation time, and the technology has been developed. Subsequent to the cell projection delineation method, S. D. Berger et al. proposed a new electron-beam projection system (SCALPEL system) about eight years ago. After that, a similar delineation system (PREVAIL system) and various proposals regarding a transfer mask (reticle) structure to be applied to those delineation systems, and a method for manufacturing the mask, have been made.

For example, Japanese Patent No. 2829942 (Japanese Unexamined Patent Application Publication No. 7-201726) relates to the PREVAIL system invented by H. C. Pfeiffer et al. In brief a stencil mask is prepared in which an opening (aperture) pattern with a predetermined size is formed in a predetermined arrangement in each small field. Charged-particle beams are irradiated to the small fields. The opening pattern is reduced and transferred to an exposed substrate, on which a photosensitive material is formed, using the beams shaped by the opening pattern through an optical system. The predetermined patterns divided (split) and formed on the mask are connected to each other on the exposed substrate to form a device pattern. As a transfer mask proposed for such a system, a stencil type mask in which a pattern portion comprises an opening that is not shielded completely is used as a main structure (Japanese Unexamined Patent Application Publication No. 10-261584, Japanese Unexamined Patent Application Publication No. 10-260523, or the like). For the stencil type mask, the backside surface of a pattern field is split and reinforced by a strut (bridge) structure, thereby improving a reduction in distortion of the pattern field. Consequently, pattern position accuracy is improved.

As a mask structure for the SCALPEL system, a scattering mask (reticle) is proposed other than the stencil mask. Those are specifically described in, for example, a cited document (by S. D. Berger & J. M. Gibson, APPL. PHYS. LETTERS 57 (2) (1990) 153), Japanese Unexamined Patent Application Publication No. 10-261584, and Japanese Unexamined Patent Application Publication No. 10-321495. In the above references, for the mask structure, a heavy-metal film is formed on a membrane (self-supporting thin film) made of SiN or the like and a desired pattern is formed into the heavy-metal film. According to a method using the mask structure, electron beams are irradiated to both the films. The electron scattering degrees of the films differs depending on the presence or absence of an electron-beam scatterer. Exploiting the difference of the scattering degrees, beam contrast on a wafer is obtained, thereby reducing and transferring the pattern.

According to those exposure systems, high-resolution properties serving as features of the charged-particle beams are obtained and a pattern finer than 0.1 $\mu$m can be formed. Compared with the cell projection method, due to sharp enlargement of a shot size (for example, the maximum shot size on the exposed substrate is increased from 5 $\mu$m to 250 $\mu$m), throughput in production of a device is improved (for example, in case of an 8-inch substrate having the minimum line width of 0.08 $\mu$m, throughput of 30 wafers/hour or higher). The system is capable of manufacturing a general-purpose device and is of much practical use.

As mentioned above, in the electron-beam projection exposure (EPL: PREVAIL, SCALPEL), two kinds of mask structures, namely, the stencil type and the membrane type are proposed. The stencil mask is fabricated using an SOI wafer by shaping processing such as dry etching. Since mask magnification is set to low magnification, for example, 4 times, the mask pattern is extremely fine. For the thickness, 2 $\mu$m is standard from the viewpoint of workability and heat conductivity. The stencil type conventionally has a problem regarding the drop of a ring pattern called "a doughnut problem." Consequently, a complementary mask method for performing pattern split has been proposed. However, in association with finer pattern designing, the mechanical strength (intensity) is may be adversely affected, depending on the pattern formed in the transfer field. It is considered that complementary division in a wide area is needed.

As related arts regarding the complementary division of the pattern, for example, Japanese Unexamined Patent Application Publication No. 11-26372 is mentioned. This publication discloses that a cantilever pattern low-supporting pattern: pattern in which one end is connected to a mask material) needs complementary division. This publication also discloses that a pattern in which both ends are supported has no problem of mechanical strength.

However, especially in a cantilever (leaf) portion or a line and space pattern (an L&S bridge portion), there is concern regarding mask workability due to low mechanical strength and breakage caused by stress concentration. The present inventor has studied the relation between the pattern size and the intensity of the cantilever pattern and the relation with the intensity of the both-end-supported pattern, thereby accomplishing the present invention.

SUMMARY OF THE INVENTION

The present invention relates to a transfer mask for transferring a transfer pattern to a substrate which is transferred by the use of energy beams. The transfer mask has shielding patterns made from thin film by forming aperture patterns in a thin film portion supported by a supporting frame.

In a first aspect of the invention, a shielding pattern split or division for forming a complementary pattern is provided in which the pattern, before forming a split pattern, is on one end connected and supported by the supporting frame. Further, the ratio of the pattern surface area to the supporting frame cross sectional area is larger than 5,000.

In a second aspect of the invention, the transfer mask comprises a shielding pattern for which it is not necessary to be divided to form a complementary pattern. In this case, the pattern is on one end connected and supported by the supporting frame, and the ratio of the pattern surface area to the supporting frame cross sectional area is equal to or less than 5,000.

In a third aspect of the invention, the transfer mask comprises a shielding pattern that is split for forming a complementary pattern. In this case, the pattern before forming the split pattern is a plural pattern, with two ends connected and supported by the supporting frame adjacent to each other. Further, the length of the shielding patterns are equal or larger than the allowable length y, where $y=412.5X-95.33$, with X being the pattern width.

In another aspect of the invention, the pattern split method for transferring a transferred pattern to the substrate of a transfer mask by the use of energy beams is disclosed. In the method, the transfer mask includes shielding patterns made from thin film by forming aperture patterns in a thin film portion that is supported by a supporting frame.

In one aspect of the pattern split method, if the transfer mask has a shielding pattern which is on one end connected and supported by the supporting frame, it is determined whether it is necessary to split shielding pattern for forming a complementary pattern in accordance with the surface area and the supporting frame cross-sectional area of the shielding pattern. When the ration of the pattern surface area to the supporting frame cross sectional is larger than 5,000, the shielding patterns is split. If the ratio is less than 5,000, the shielding pattern is not split.

In another aspect of the pattern split method, the transfer mask has a shielding pattern which is a plural pattern, with two ends connected and supported by the supporting frame adjacent to each other. In this method, it is determined whether it is necessary to split the shielding pattern for forming a complimentary patter in accordance with the length and width of the shielding pattern. The pattern is split when the length of the shielding patterns are equal to or larger than an allowable length y, where $y=412.5X-95.33$, with X being the pattern width. This results in the shielding patterns having a length smaller then the allowable length y, and a density smaller then the pattern before being split. Conversely, the pattern is not split when the length of the shielding patterns are smaller then the allowable length y.

Related methods for manufacturing the transfer mask are also disclosed.

DETAILED DESCRIPTION (Embodiment 1)

In the present embodiment, a case where a transfer pattern has a shielding pattern in which one part is connected to the periphery of the transfer pattern will now be explained.

First, an aperture pattern on a stencil mask to form a transfer pattern having a shielding pattern supported at a position of the periphery was evaluated.

Patterns were formed so that L&Ss ("line and space patterns") having various modified sizes and aspects (aspect ratios) and low-supporting portions having modified sizes were evaluated. A mask was formed using an SOI substrate (Silicon On Insulator; substrate having such a structure that two silicon substrates are adhered through $SiO_2$) and the external view thereof was observed with a light microscope or the like to make evaluation. It is considered as a result that in association with trends towards finer pattern designing, the rigidity in the lateral direction of the pattern is adversely affected, the influence of surface tension of pure water or the like is exerted upon self-supporting patterns. Since the $SiO_2$ film was eliminated using dilute hydrofluoric acid or BHF, it was confirmed that the surface of silicon was active. It is considered that the above was caused due to local stress concentration. Formation defects caused by such a degradation in mechanical strength requires the formation of complementary patterns.

Figure 1:
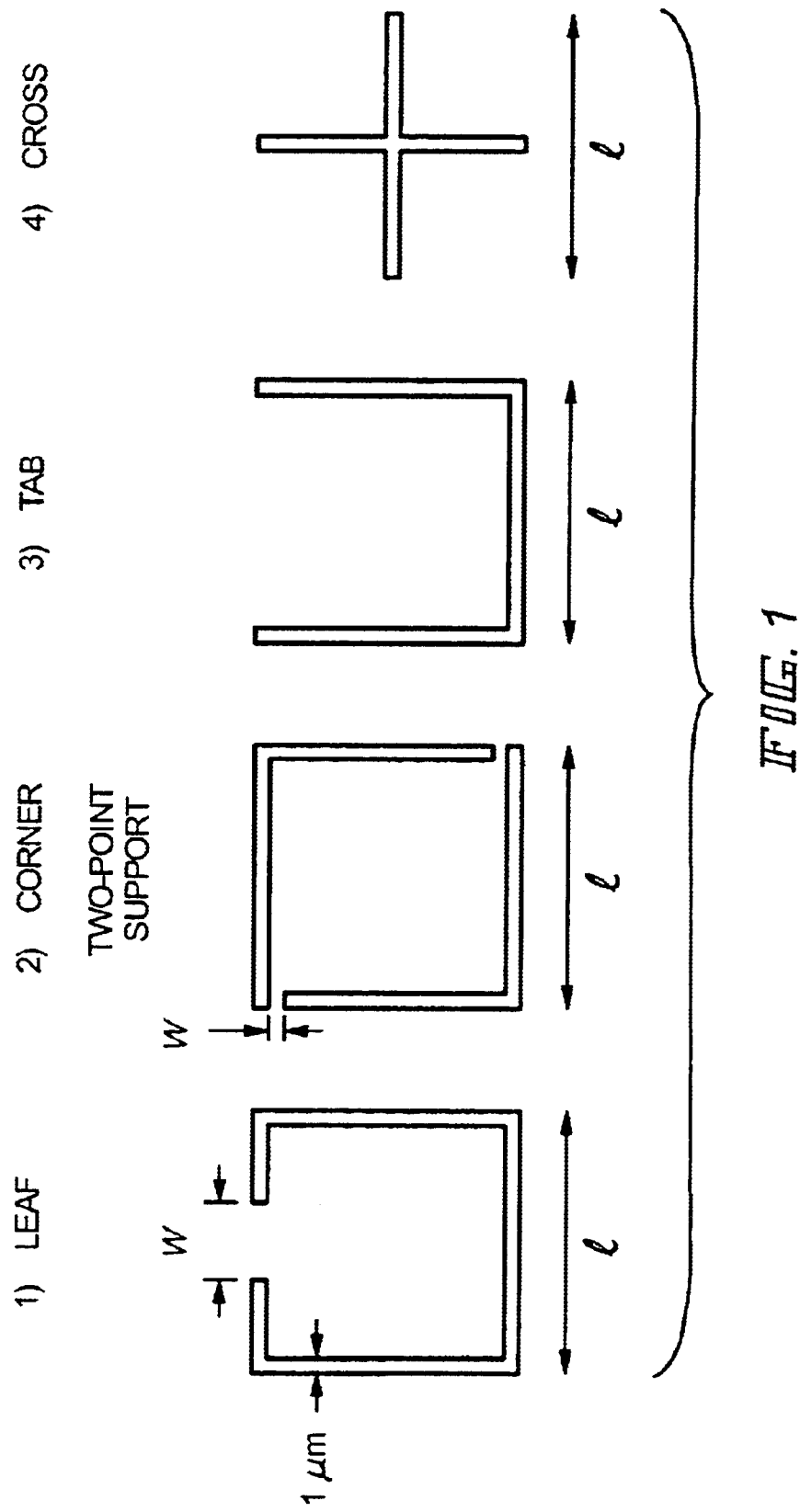
FIG. 1 is a schematic diagram of a low-supporting pattern in an embodiment 1.

FIG. 1 shows examples of the low-supporting patterns. Regarding those patterns, the intensities of the patterns having various modified sizes were confirmed as shown in Table 1.

TABLE 1

| I | W |
|---|---|
| 10 $\mu$m | 1, 2, 5 |
| 100 $\mu$m | 1, 5, 50 |
| 500 $\mu$m | 1, 50, 250 |

Consequently, in the large pattern (for example, when the thickness is 2 $\mu$m, the area is equal to or larger than 0.04 $mm^2$), when a supporting area is equal to or smaller than ¼ of the outer circumference of the low-supporting pattern, it was found that the pattern was easily broken due to stress concentration at the end of an aperture portion during processing, irrespective of the supporting shape and supporting size. In the small pattern (for example, when the thickness is 2 $\mu$m, the area is equal to or smaller than 0.01 $mm^2$), it turned out that the low-supporting pattern, such as a cantilever pattern, was not broken and complementary division was not needed. In other words, when it was found that the area effect was large in the low-supporting pattern, complementary division was necessary in the large pattern, and the complementation was not needed in the small pattern, consequently, even in case of the low-supporting pattern, it is unnecessary to forcibly realize the complementation, resulting in a reduction in pattern area. When the split of the small low-supporting pattern avoided, it is possible to avoid the volume of pattern data from extremely increasing.

That is, consequently, as to the splitting (complementary division) of the pattern, in case of the low-supporting pattern (cantilever pattern), when the ratio of the surface area of one plane of a pattern supported by the supporting portion to the cross sectional area of the supporting portion is larger than 5000, the pattern split is performed. In this case, the pattern area is split so that the maximum ratio of the pattern surface area to the cross sectional area of the supporting portion is equal to or less than 5000.

Subsequently, on the basis of the above evaluation result, for the transfer pattern in which the ratio of the surface area on the mask to the cross sectional area of the supporting portion is larger than 5000, the complementary split is performed on the stencil mask.

A split method is performed so that each pattern area density in an exposed area is substantially uniform and a micro pattern is not formed by the pattern split. Two mask fields are formed. When the transfer pattern is equal to or less than 0.01 mm$^2$ on the mask (the ratio of the surface area of the pattern to the cross sectional area of the supporting portion is equal to or less than 5000), complementary division is not performed and one pattern field is formed in the same way as that of the above evaluation.

That is, the stencil mask is manufactured by, for example, the following method.

A pattern data processing is performed as follows. After the so-called outline processing is performed to pattern data, whether the pattern split is needed is determined according to the above method. According to the determination, the pattern split is performed to the pattern data requiring the pattern split. After that, the so-called proximity-effect correction processing is performed to the pattern data, and the data is then converted into EB (electron-beam delineation) data.

As for manufacturing the mask, a thin film (SiO$_2$ or the like) for an etching mask layer is first formed on an SOI substrate and resist is formed in mask blanks. The rear surface of each of the mask blanks is then subjected to a recess processing. The EB data is delineated onto the resist and is then developed to form a resist pattern. After that, an etching mask layer is formed, dry etching is then performed to form an aperture pattern (scattering layer pattern), and the etching mask layer is removed. After that, washing and inspection are performed to complete the transfer mask.

When the transfer pattern is formed using the mask by a device such as an EB stepper, a fine transfer pattern of 0.100 nm or less for a high-technology device can be formed.

The transfer pattern having a shielding pattern in which one part is connected to the periphery thereof is not limited to the above-mentioned patterns. The above reference can be applied to a low-supporting pattern with a complicated shape.

(Embodiment 2)

According to the present embodiment, a case where a transfer pattern has a shielding pattern in which both ends are connected to the transfer pattern will now be described.

First, an aperture pattern on a stencil mask to form such a shielding pattern, in which both ends are connected to the transfer pattern, was evaluated.

Next, the intensities of linear patterns having various sizes as shown in Table 2 were confirmed.

TABLE 2

| Width (μm) | Length (μm) |
|---|---|
| 0.24 | 10 |
| 0.32 | 20 |
| 0.40 | 30 |
| 0.48 | 40 |

The evaluation was performed after a wet cleaning processing. An estimate of the amount of pattern distortion in the evaluation can be represented by Equation 1.

$$\delta = (1/384) \cdot (Wl^3/EI) \qquad \text{(Equation 1)}$$

Where,

δ: the amount of pattern distortion
E: Young's modulus
I: second moment of area
W: uniformly distributed load
l: pattern length Flexural rigidity EI can be obtained using the following equations.

Second moment of area in the longitudinal direction:

$$I_v = ab^3/12$$

Second moment of area in the lateral direction:

$$I_h = a^3b/12$$

Where, reference symbol "a" denotes a pattern width and reference symbol "b" denotes a pattern length.

Figure 2:
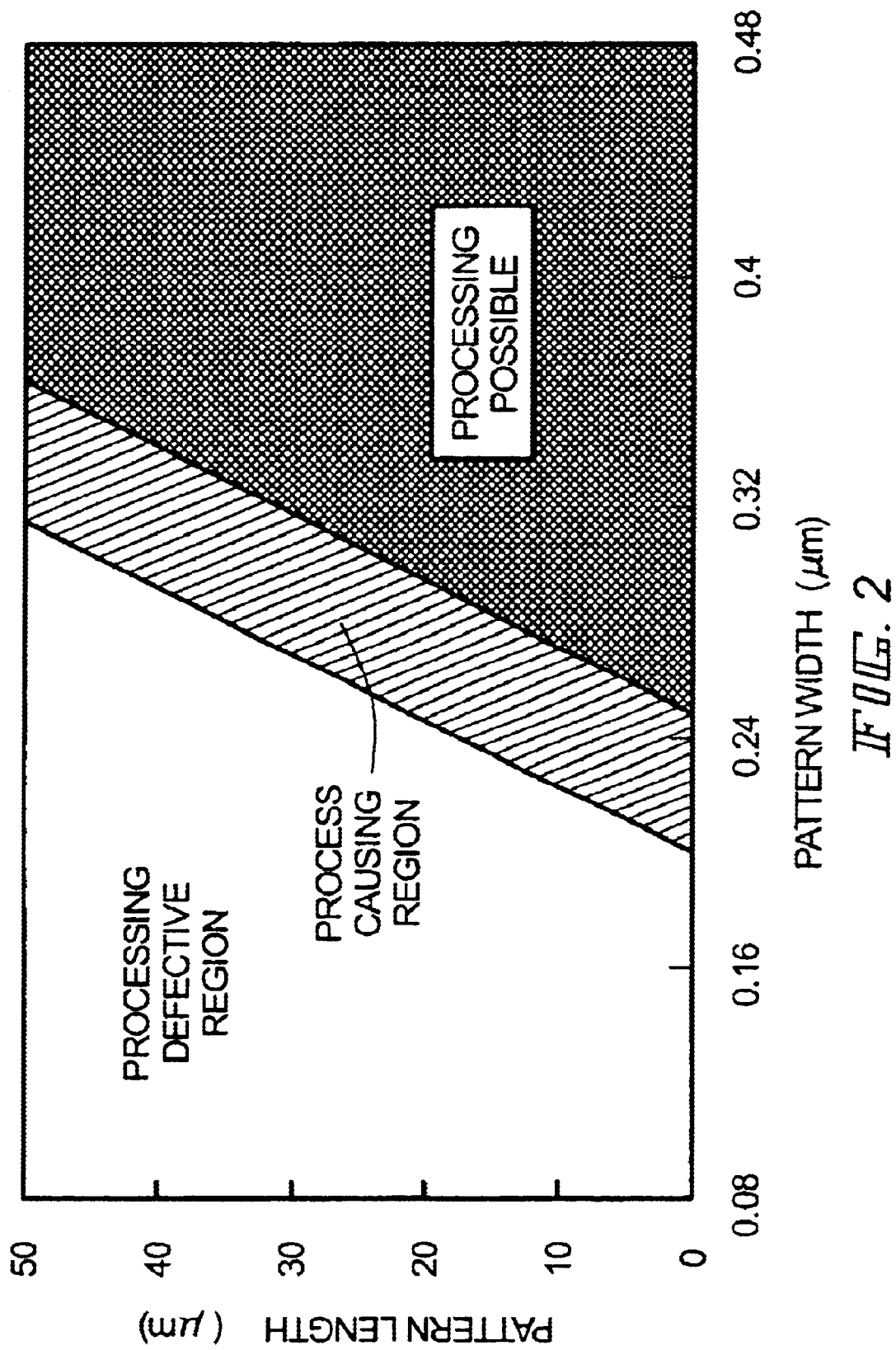
FIG. 2 is a graph showing a relation between a pattern length and a pattern width regarding the division of a linear pattern in an embodiment 2.

The pattern intensity generally cited in the stencil mask is concerned with the vertical direction. As for an EPL stencil mask, since the thickness is equal to 2 μm, the intensity in the vertical direction presents no problem. When the mask is actually processed, the intensity in the vertical direction presents no problem so long as the ratio of the pattern width to the length is about 2000, as described in Japanese Unexamined Patent Application No. 11-26372. However, in order to form a pattern according to an NGL (next-generation lithography) specification, the minimum width of an aperture (stencil) pattern formed in the EPL stencil mask is set to about 0.2 to 0.3 μm, so that the flexural rigidity (EI) in the lateral direction is significantly degraded. Consequently, it is found that the pattern strength (intensity) is also degraded. It turns out that the pattern is deformed due to the surface tension of a solvent such as pure rinse during processing and the adjacent patterns are adhered and fixed to each other in a dense pattern portion due to an intermolecular force. From this problem, it turns out that the formation of a complementary pattern is needed in the both-end-supported pattern, which does not present a problem. FIG. 2 shows the pattern length allowed in case of 1:1 L&S with respect to the division (split) of the linear (straight line, L-shaped, cross, or the like) pattern. Pattern deformation by gravitation within an elastic region can be obtained using Equation 1.

In the equation shown in this instance, the length of a pattern, (which can be normally processed when a pure water processing used for a mask manufacturing step is performed, the surface tension effect of pure water is considered, and the mask manufacture processing is performed), is obtained by experiments.

The equation used in the calculation is primarily approximated with respect to the most important pattern size range of 0.2 μm to 0.5 μm. In the future, when trends toward finer pattern designing are advanced and the pattern size on the mask is finer than 0.2 µm, the equation is not limited to the above equation.

$$\text{Allowable pattern length } (y) = 412.5X - 95.33 \quad \text{(Equation 2)}$$

X: pattern width

For example, the maximum allowable pattern length of a 1:1 L&S pattern having a size of 0.2 µm is equal to 3.67 µm from the above equation. That is, when a pattern has a length longer than the above, the pattern split is performed.

In this case, even in case of a pattern having, for example, a size of 0.2 µm and a thickness of 2µ, as long as the duty ratio is 1:2 L&S, the allowable pattern length is equal to 69.7 µm. As mentioned above, it becomes clear that the presence or absence of the pattern split depends on the pattern duty ratio and the thickness. Consequently, since the number of patterns to be split can be limited, the extreme increase of the amount of pattern data can be suppressed.

Figure 3:
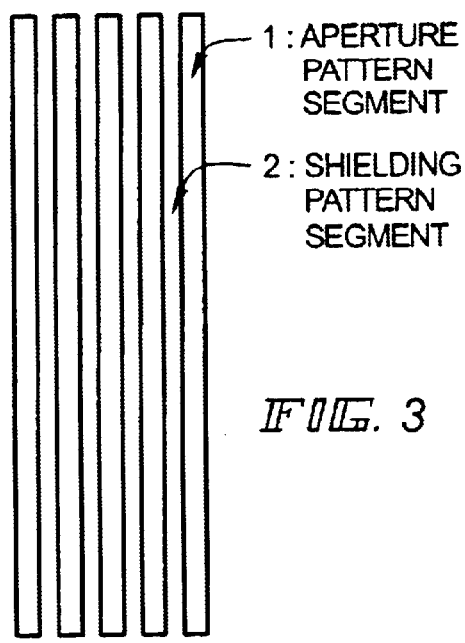
FIG. 3 is a pattern schematic diagram (base data) of the embodiment 2.
Figure 4:
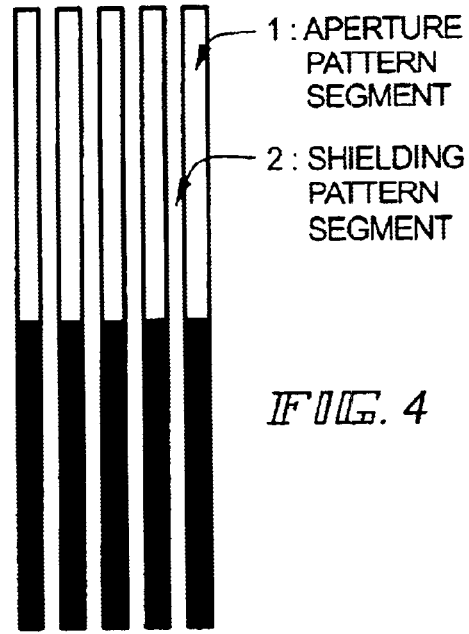
FIG. 4 is a pattern schematic diagram showing a pattern division example (undesirable example) in the embodiment 2.
Figure 5:
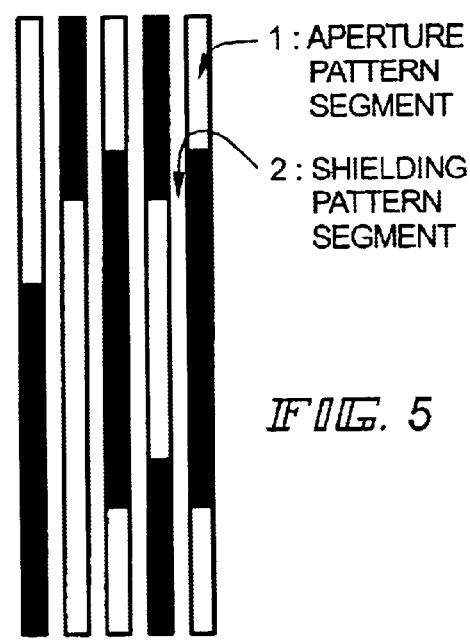
FIG. 5 is a pattern schematic diagram showing a pattern division example (preferred example) in the embodiment 2.
Figure 6:
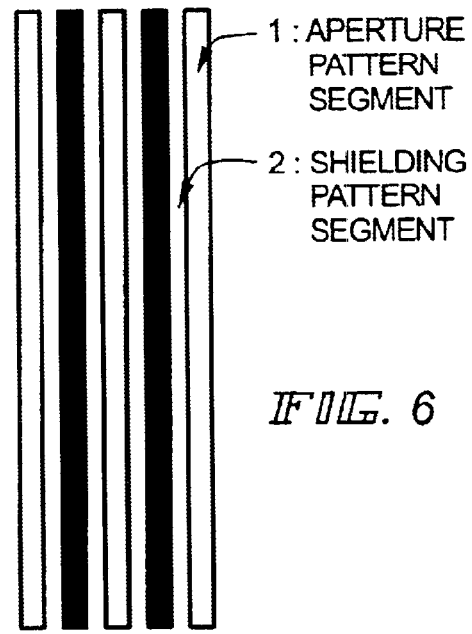
FIG. 6 is a pattern schematic diagram showing a pattern division example (preferred example) in the embodiment 2.

Next, on the basis of the above evaluation result, the stencil mask is subjected to a complementary division so that the shielding pattern length for transfer satisfies Equation 2. For example, a 1:1 L&S pattern having aperture pattern segments 1 and shielding pattern segments 2 as shown in FIG. 3 is split. In this case, as shown in FIG. 4, when the pattern is simply split according to the ratio of the pattern length to the pattern width (aspect ratio), the split segments are two-dimensionally split at predetermined positions. In this case, the split causes stress concentration and becomes a factor of membrane damage. It is not desirable. Accordingly, the pattern split at a predetermined length is avoided as much as possible. For example, when the 1:1 L&S pattern is split as shown in FIG. 5, the deviation of the low density of the pattern can be prevented and the stress concentration of the pattern can also be prevented. When the split is performed so that the duty ratio is set to 1:3 as shown in FIG. 6, the low density can be reduced. It is preferable. In this instance, in FIGS. 4 to 6, the portions filled with black are portions subjected to complementary division.

As for a pattern in which two mask fields are formed and the length of the transfer shielding pattern is equal to or less than the allowable pattern length obtained by Equation 2, complementary division is not performed and one pattern field is formed in the same way as that of the foregoing evaluation. The specific stencil mask manufacturing method is the same as that of the embodiment 1. When a transfer pattern is formed using those masks, a fine pattern of 100 nm or less can be transferred and formed.

According to the present invention, the constitution and the manufacturing method of the stencil mask are not limited to those in the above embodiments.

INDUSTRIAL APPLICABILITY

The present invention can be utilized to obtain a transfer mask used for an electron-beam projection exposure method. Particularly, since whether complementary division is needed is determined to form an aperture pattern, it is possible to obtain a transfer mask, in which the pattern area can be reduced, an extreme increase in pattern data can be suppressed, and a transfer pattern can be transferred with high precision.

What is claimed is:

1. A transfer mask to transfer a transfer pattern to a substrate by use of energy beams, having shielding patterns made from thin film by forming aperture patterns in a thin film portion supported by a supporting frame, said transfer mask comprising:

a shielding pattern split for forming a complementary pattern, wherein the pattern before forming said split pattern is on one end connected and supported by a supporting portion and the ratio of the pattern surface area to the supporting portion cross sectional area (the surface area/the supporting portion cross sectional area) is larger than 5000.

2. A transfer mask to transfer a transfer pattern to a substrate by use of energy beams, having shielding patterns made from thin film by forming aperture patterns in a thin film portion supported by a supporting frame, said transfer mask comprising:

a shielding pattern which is not required to be split for forming a complementary pattern, wherein the pattern is on one end connected and supported by a supporting portion and the ratio of the pattern surface area to the supporting portion cross sectional area (the surface area/the supporting portion cross sectional area) is equal to or less than 5000.

3. A transfer mask to transfer a transfer pattern to a substrate by use of energy beams, having shielding patterns made from thin film by forming aperture patterns in a thin film portion supported by a supporting frame, said transfer mask comprising:

a shielding pattern split for forming a complementary pattern, wherein the pattern before forming said split pattern is a plural pattern with two ends connected and supported by a supporting portion adjacent to each other and the length of the shielding patterns are equal or larger than an allowable length y represented by Equation 2 so that the split shielding patterns have the length smaller than the allowable length y and the density smaller than the pattern before split.

$$\text{Allowable pattern length } (y) = 412.5X - 95.33 \quad \text{(Equation 2)}$$

X: pattern width.

4. The transfer mask according to claim 1 or 2, wherein said transfer mask includes a plurality of pattern fields having a shielding pattern split for forming a complementary pattern in each pattern field.

5. A pattern split method for a transfer mask to transfer a transfer pattern to a substrate by use of energy beams, having shielding patterns made from thin film by forming aperture patterns in a thin film portion supported by a supporting frame, said method comprising a step of:

in the case when the transfer mask has a shielding pattern which is on one end connected and supported by a supporting portion, determining whether it is necessary to split the shielding pattern for forming a complementary pattern in accordance with the surface area and the supporting portion cross sectional area of the shielding pattern.

6. The pattern split method according to claim 5, said method further comprising steps of: determining to split the shielding pattern when the ratio of the pattern surface area to the supporting portion cross sectional area (the surface area/the supporting portion cross sectional area) is larger than 5000; and determining not to split when the ratio is equal to or less than 5000.

7. A pattern split method of a transfer mask to transfer a transfer pattern to: a substrate by use of energy beams, having shielding patterns made from thin film by forming aperture patterns in a thin film portion supported by a supporting frame, said method comprising a step of:

in the case when the transfer mask has a shielding pattern which is a plural pattern with two ends connected and supported by a supporting portion adjacent to each other, determining whether it is necessary to split the shielding pattern for forming a complementary pattern in accordance with the length and width of the shielding pattern.

8. The pattern split method according to claim 7, said method further comprising steps of: determining to split the shielding pattern when the length of the shielding patterns are equal to or larger than an allowable length y represented by Equation 2 so that the split shielding patterns have the length smaller than the allowable length y and the density smaller than the pattern before split; and determining not to split when the length of the shielding patterns are smaller than the allowable length y.

$$\text{Allowable pattern length } (y) = 412.5X - 95.33 \quad \text{(Equation 2)}$$

X: pattern width.

9. A manufacturing method of a transfer mask to transfer a transfer pattern to a substrate by use of energy beams, having shielding patterns made from thin film by forming aperture patterns in a thin film portion supported by a supporting frame, said method comprising steps of:

determining whether it is necessary to split the shielding pattern for forming a complementary pattern on pattern data and forming a split pattern data if necessary;

performing a pattern proximity-effect correction to said pattern data;

converting the data into the transferring data and transferring said data to a photosensitive material on the substrate; and forming the aperture pattern in the thin film portion by a dry etching method, wherein said determining step, in the case when the transfer mask has a shielding pattern which is one end connected and supported by a supporting portion, determines whether it is necessary to split the shielding pattern for forming a complementary pattern in accordance with the surface area and the supporting portion cross sectional area of the shielding pattern.

10. A manufacturing method of a transfer mask to transfer a transfer pattern to a substrate by use of energy beams, having shielding patterns made from thin film by forming aperture patterns in a thin film portion supported by a supporting frame, said method comprising steps of:

performing a pattern proximity-effect correction on pattern data;

determining whether it is necessary to split the shielding pattern for forming a complementary pattern and forming a split pattern data if necessary on said pattern data;

converting the data into the transferring data and transferring said data to a photosensitive material on the substrate; and forming the aperture pattern in the thin film portion by a dry etching method, wherein said determining step, in the case when the transfer mask has a shielding pattern which is one end connected and supported by a supporting portion, determines whether it is necessary to split the shielding pattern for forming a complementary pattern in accordance with the surface area and the supporting portion cross sectional area of the shielding pattern.

11. A manufacturing method of a transfer mask to transfer a transfer pattern to a substrate by use of energy beams, having shielding patterns made from thin film by forming aperture patterns in a thin film portion supported by a supporting frame, said method comprising steps of:

determining whether it is necessary to split the shielding pattern for forming a complementary pattern on pattern data and forming a split pattern data if necessary;

performing a pattern proximity-effect correction to said pattern data;

converting the data into the transferring data and transferring said data to a photosensitive material on the substrate; and forming the aperture pattern in the thin film portion by a dry etching method, wherein said determining step, in the case when the transfer mask has a shielding pattern which is a plural patterns with two ends connected and supported by a supporting portion adjacent to each other, determines whether it is necessary to split the shielding pattern for forming a complementary pattern in accordance with the length and width of the shielding pattern.

12. A manufacturing method of a transfer mask to transfer a transfer pattern to a substrate by use of energy beams, having shielding patterns made from thin film by forming aperture patterns in a thin film portion supported by a supporting frame, said method comprising steps of:

performing a pattern proximity-effect correction on pattern data;

determining whether it is necessary to split the shielding pattern for forming a complementary pattern and forming a split pattern data if necessary on said pattern data;

performing a pattern proximity-effect correction to said pattern data;

converting the data into the transferring data and transferring said data to a photosensitive material on the substrate; and forming the aperture pattern in the thin film portion by a dry etching method, wherein said determining step, in the case when the transfer mask has a shielding pattern which is a plural patterns with two ends connected and supported by a supporting portion adjacent to each other, determines whether it is necessary to split the shielding pattern for forming a complementary pattern in accordance with the length and width of the shielding pattern.

* * * * *